(12) United States Patent
Rembach

(10) Patent No.: US 8,537,536 B1
(45) Date of Patent: Sep. 17, 2013

(54) RAPID DEPLOYMENT MOBILE DATA CENTER

(76) Inventor: Paul F. Rembach, Houston, TX (US)

( * ) Notice: Subject to any disclaimer, the term of this patent is extended or adjusted under 35 U.S.C. 154(b) by 156 days.

(21) Appl. No.: 13/328,363

(22) Filed: Dec. 16, 2011

(51) Int. Cl.
G06F 1/20 (2006.01)
H05K 7/20 (2006.01)

(52) U.S. Cl.
USPC ............ 361/679.47; 361/679.48; 361/679.49; 361/679.52; 361/679.54; 361/695; 361/696; 361/700; 361/701; 361/703; 361/704; 361/715; 454/184

(58) Field of Classification Search
USPC .......... 361/679.47, 679.52, 679.54, 694–697, 361/700–701, 703–704, 715; 454/454
See application file for complete search history.

(56) References Cited

U.S. PATENT DOCUMENTS

| | | | |
|---|---|---|---|
| 6,341,064 B1 | 1/2002 | Bradley | |
| 6,652,373 B2 * | 11/2003 | Sharp et al. | 454/184 |
| 6,652,374 B2 * | 11/2003 | Sharp et al. | 454/184 |
| 6,742,583 B2 | 6/2004 | Tikka | |
| 7,278,273 B1 * | 10/2007 | Whitted et al. | 62/259.2 |
| 7,405,932 B2 | 7/2008 | Vinson et al. | |
| 7,753,766 B2 * | 7/2010 | Master et al. | 454/184 |
| 7,903,404 B2 | 3/2011 | Tozer et al. | |
| 8,156,753 B2 * | 4/2012 | VanGilder et al. | 62/259.2 |
| 8,248,792 B2 * | 8/2012 | Wei | 361/692 |
| 2008/0304229 A1 | 12/2008 | June et al. | |
| 2009/0308579 A1 | 12/2009 | Johnson et al. | |
| 2013/0044426 A1 * | 2/2013 | Neumann et al. | 361/679.54 |
| 2013/0081784 A1 * | 4/2013 | Faig Palomer | 165/80.2 |
| 2013/0153200 A1 * | 6/2013 | Rembach | 165/287 |

* cited by examiner

*Primary Examiner* — Robert J Hoffberg
(74) *Attorney, Agent, or Firm* — Buskop Law Group, PC; Wendy Buskop

(57) ABSTRACT

A portable air cooled data center can include interior fans, a heat sink integrally serving as part of a wall or ceiling, and an outer heat pipe assembly in thermal communication with the heat sink allowing for heat dissipation. External fans can pull external air over the outer heat pipe assembly. A first transducer can monitor inner air temperature within the data center, a second transducer can monitor the outer heat pipe assembly, and a third transducer can be secured proximate to a fin side of the heat sink. A controller can be connected to the transducers, fans, and a power supply. Computer instructions can be used to monitor temperatures from the transducers, compare the temperatures to preset limits, and individually or simultaneously actuate, regulate, or turn off the fans when monitored temperatures meet or exceed preset limits.

20 Claims, 11 Drawing Sheets

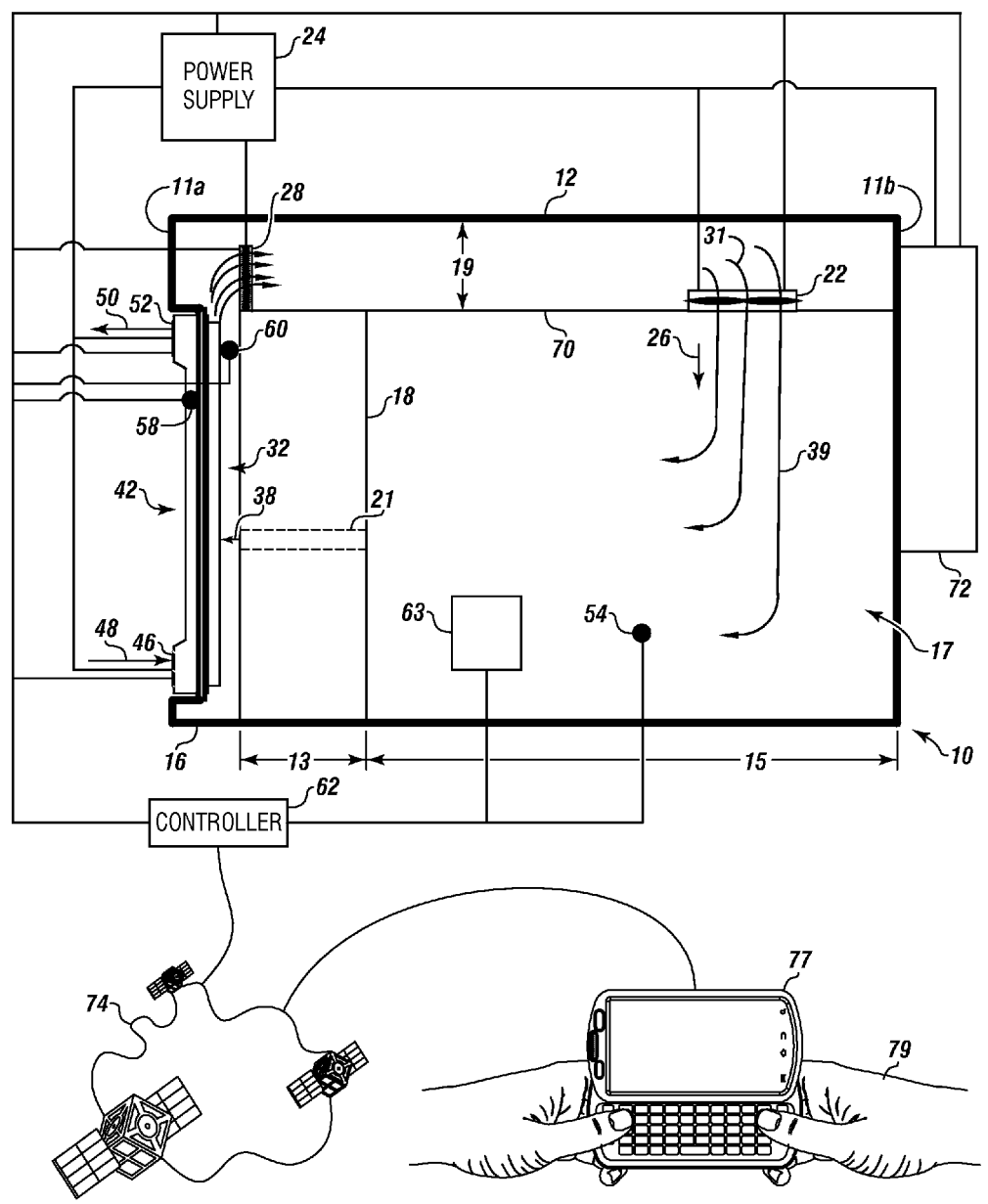

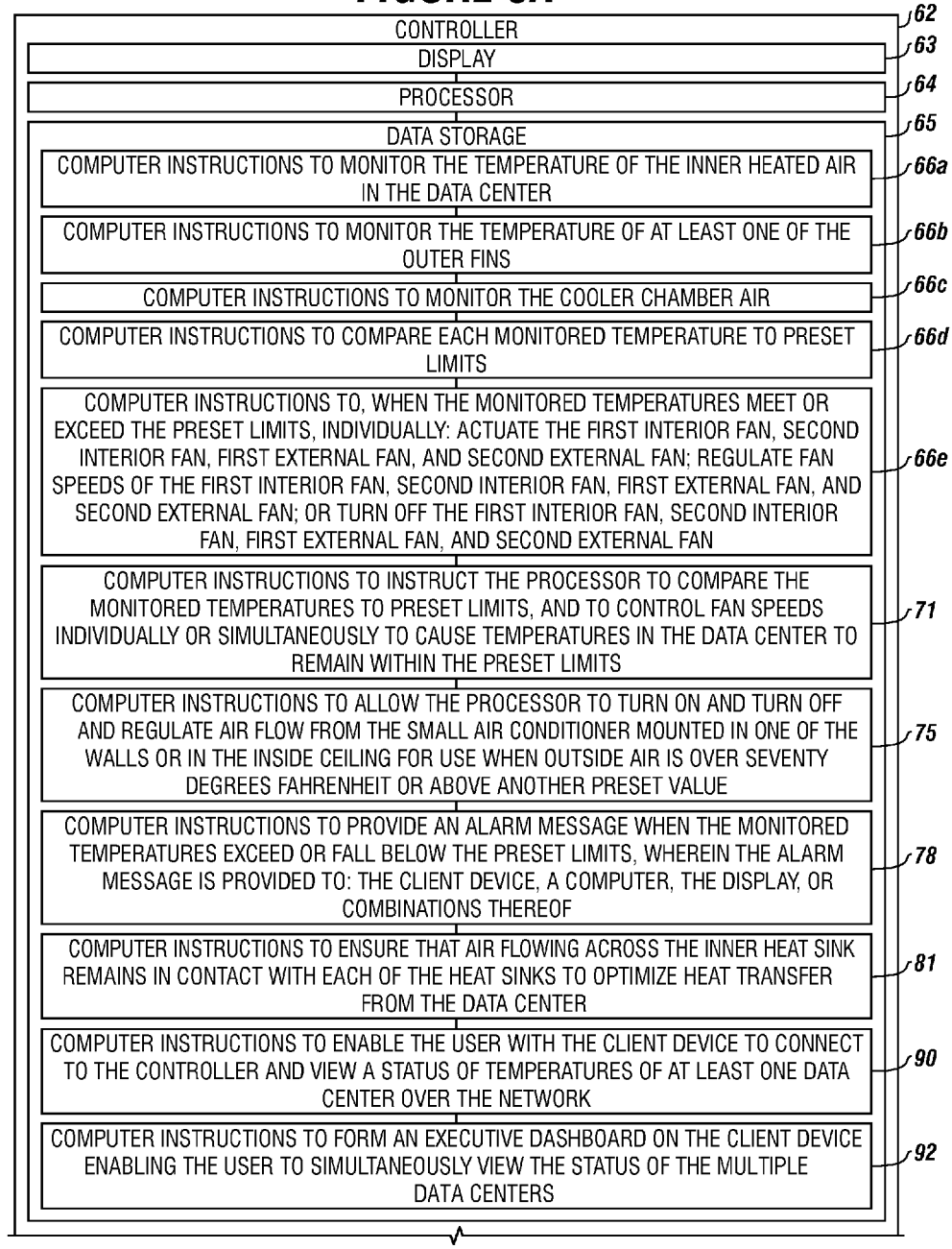

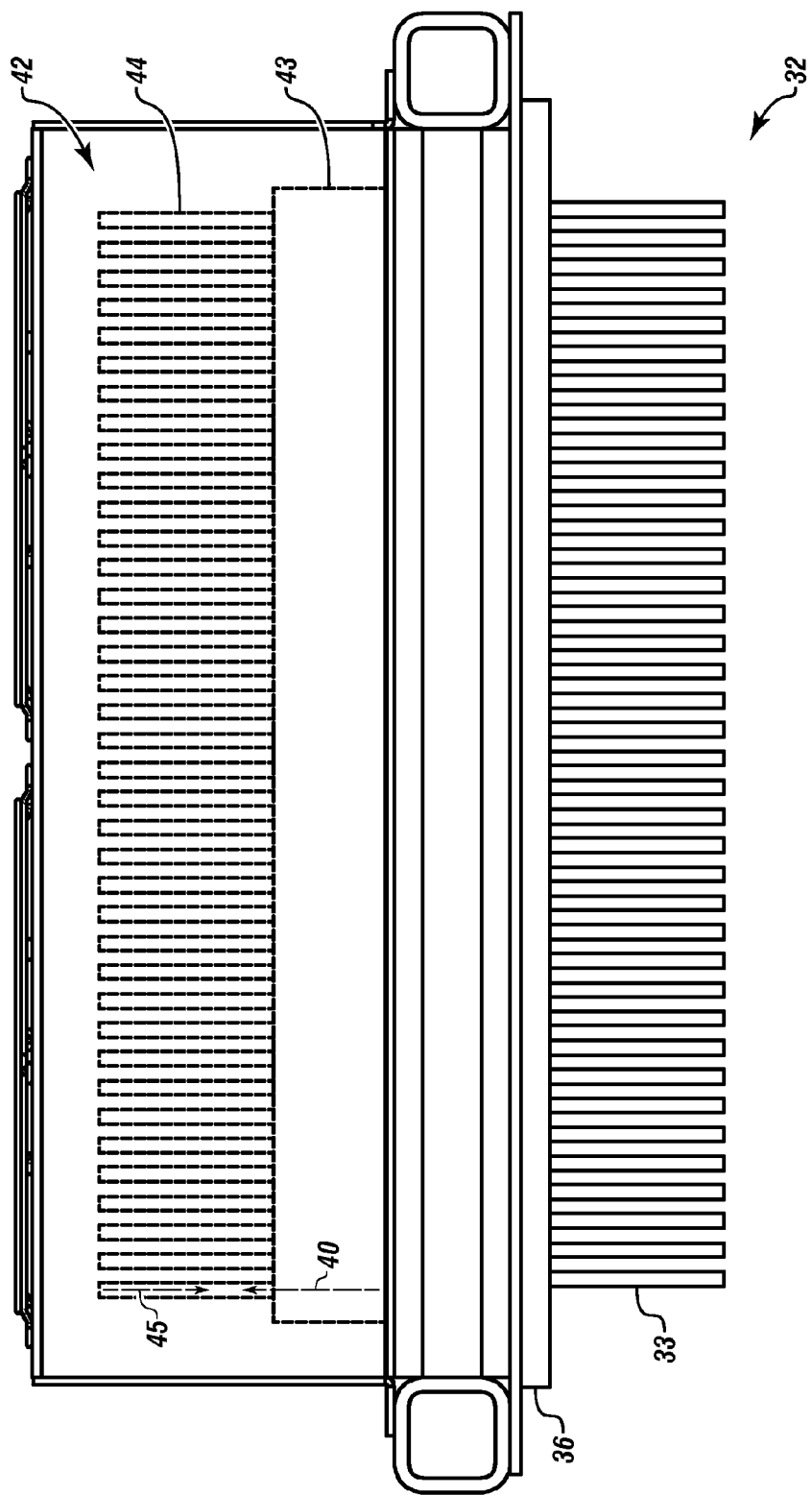

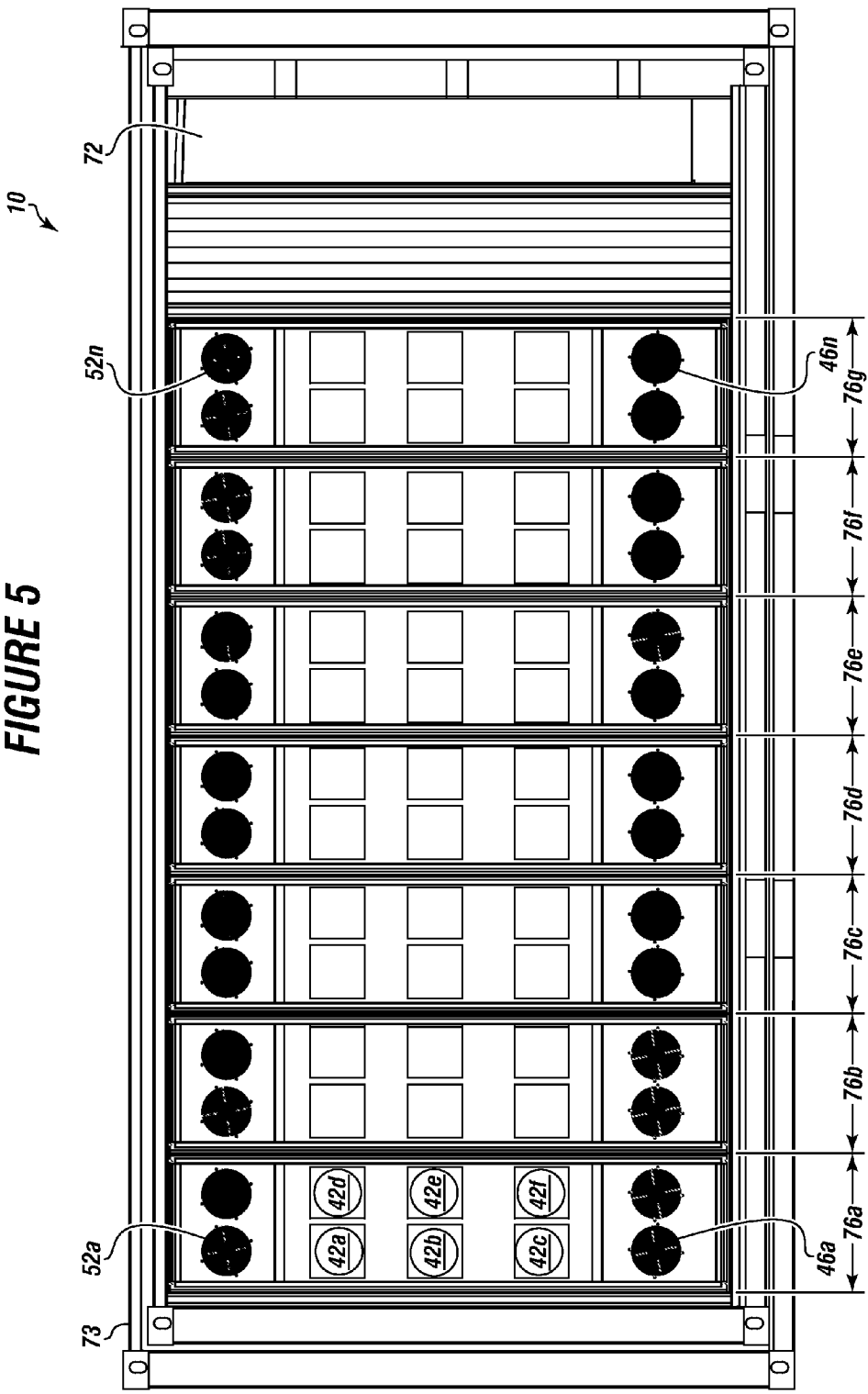

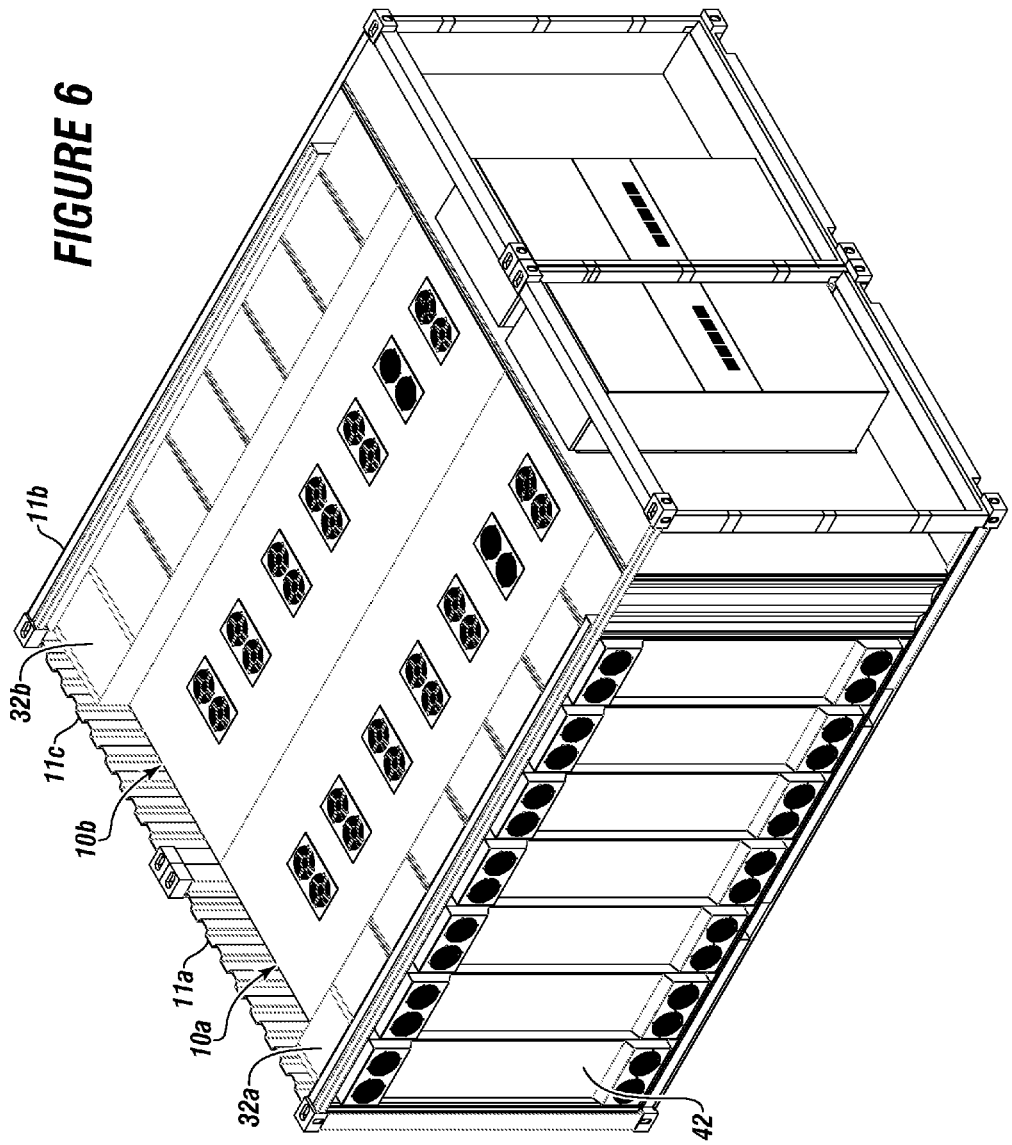

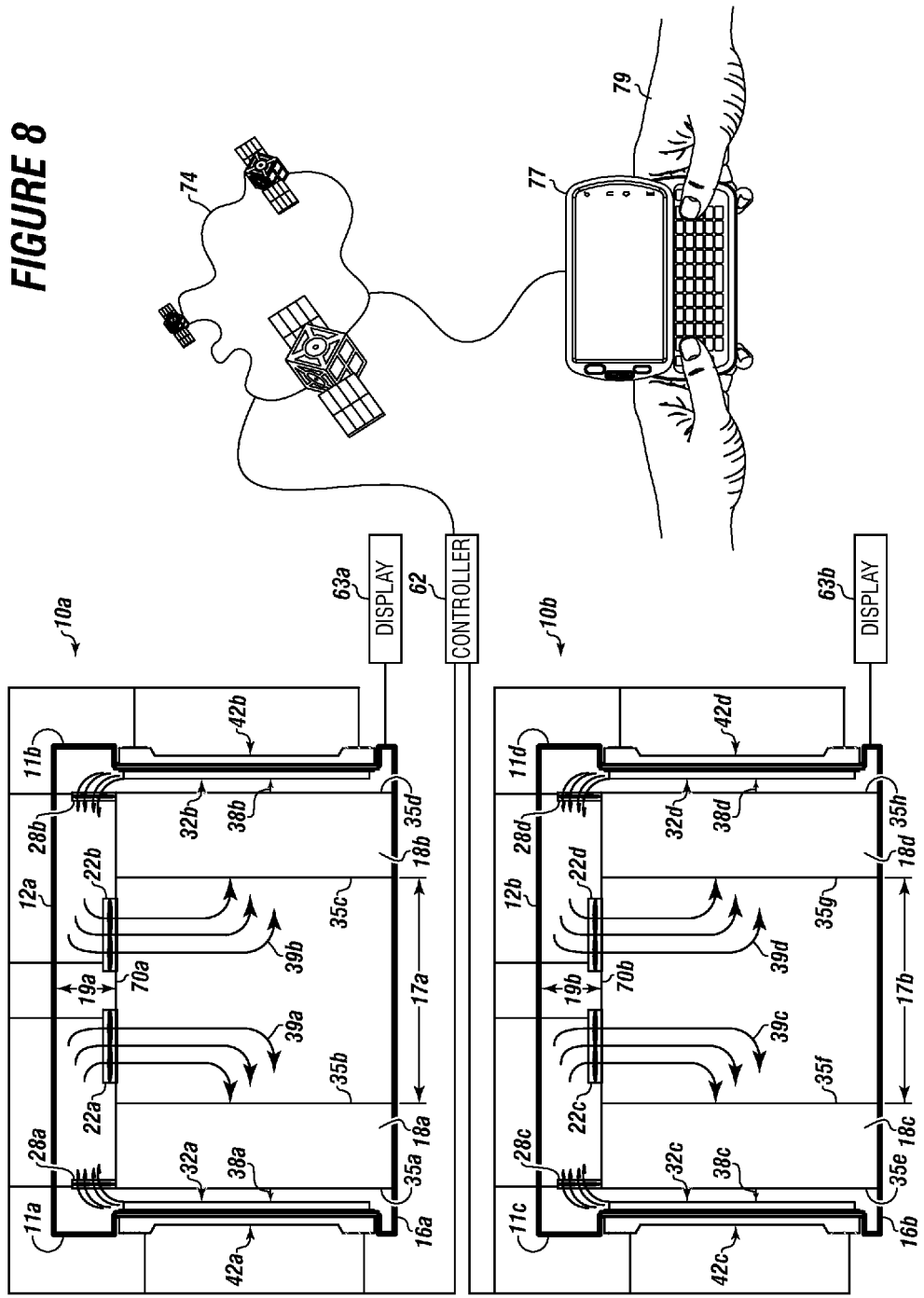

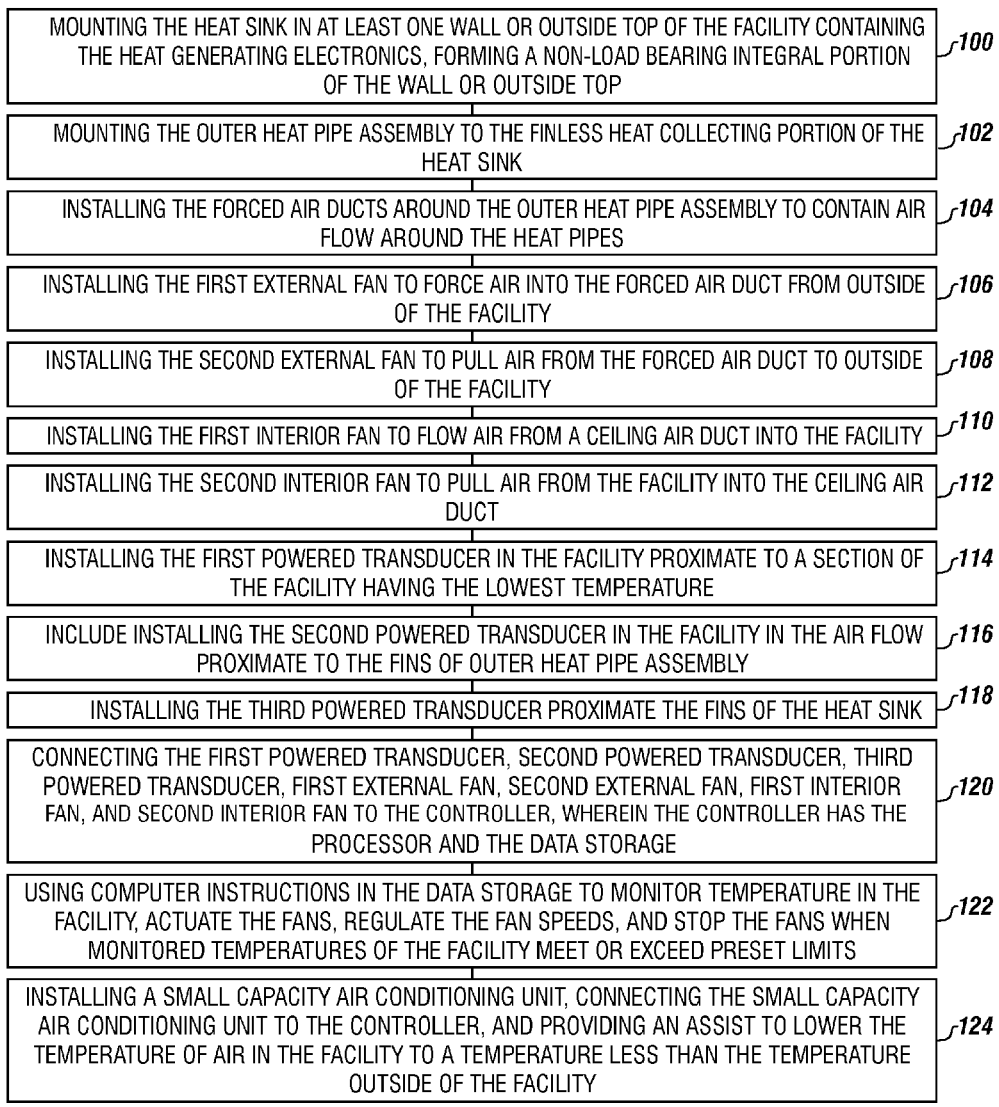

RAPID DEPLOYMENT MOBILE DATA CENTER

FIELD

The present embodiments generally relate to a portable, liftable, moveable data center that can provide cooling to heat generating electronics therein while having a reduced dependency on air conditioning or chilled water systems relative to conventional data centers containing racked electronics with heat generating sources.

BACKGROUND

A need exists for a data center that uses less electrical power than current data centers.

A further need exists for a data center than can be transported within containers.

A further need exists for data centers with a low power heat removing system that can manage temperatures in multiple data centers simultaneously from a single controller connected to a network, and can provide an executive dashboard for continuous and simultaneously monitoring and controlling of temperatures in the data centers; thereby preventing overheating while using less power than conventional data centers.

The present embodiments meet these needs.

BRIEF DESCRIPTION OF THE DRAWINGS

The detailed description will be better understood in conjunction with the accompanying drawings as follows:

FIG. 2 depicts a cut view of the system with an installed heat sink with accompanying equipment in the data center according to one or more embodiments.

FIGS. 3A-3B depict an embodiment of a controller of the system according to one or more embodiments.

FIG. 4B depicts a detailed cut view of the heat sink according to one or more embodiments.

FIG. 5 depicts a side view of the data center with the system installed therein with each heat sink having six outer heat pipe assemblies according to one or more embodiments.

FIG. 6 depicts a perspective view of the system installed into data centers connected together according to one or more embodiments.

FIG. 8 depicts an embodiment of the system installed to a plurality of data centers controlled by a single controller connected by a network.

FIG. 9 depicts an embodiment of a method for cooling a facility, such as a data center.

Figure 1:
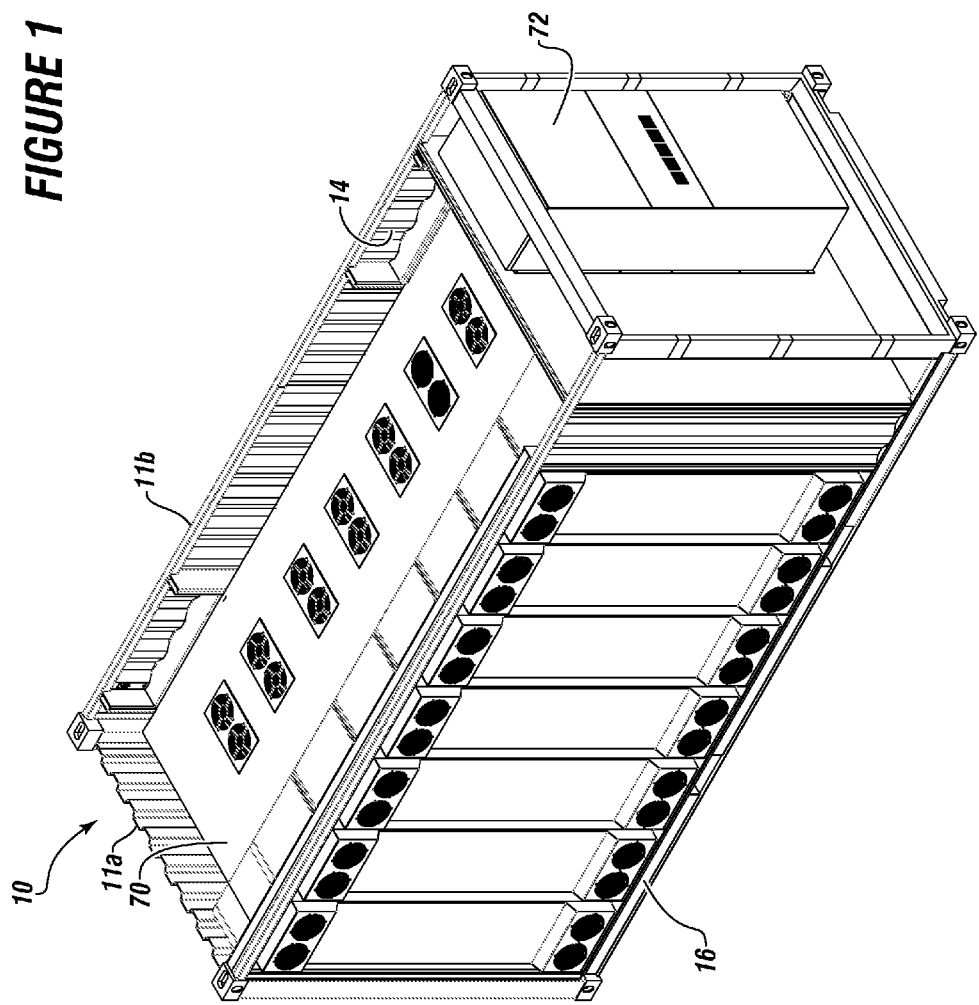
FIG. 1 depicts a perspective view of a system installed data center according to one or more embodiments.

The present embodiments are detailed below with reference to the listed Figures.

DETAILED DESCRIPTION OF THE EMBODIMENTS

Before explaining the present system in detail, it is to be understood that the system is not limited to the particular embodiments and that it can be practiced or carried out in various ways.

The present embodiments generally relate to a portable, liftable, moveable data center with a system, such as a low power heat removing system, which can provide cooling to contained heat generating electronics.

The system can be used with the data center to enable the data center to use less power by using less conventional air conditioning than currently available data centers with racked electronics having heat generating sources.

A typical data center has multiple racks of standard data servers, such as fourteen racks. A total processing power for such a typical data center is approximately twenty petabytes depending on the arrangement of the servers that a client installs. Waste heat generated in this type of typical data center is usually in amounts of about 25 kilowatts (KW) per vertical rack. For example, in the typical data center with fourteen racks, 350 KW in waste heat needs to be removed from the data center interior.

A typical cooling system in use today, such as a chill water or standard air conditioning (A/C) unit, can require approximately 99.609 tons of air conditioning per hour to cool this type of typical data center. The electrical energy requirement can be approximately 211,990 KW/hour to effectively accomplish such cooling, inclusive of losses of heat. The electrical energy costs of operating the typical cooling system hardware for the typical data center with fourteen racks at an arbitrary cost of $0.05 per KW/hour can be $7,759.00 per month.

One or more of the present embodiments can reduce the costs of power for data centers to approximately $620.74 per month, and can dramatically reduce the need for power suppliers to generate the power to cool the data centers.

One or more of the present embodiments can have a significant positive impact on carbon emissions into the environment because less power is required to operate the data centers and low power heat removing system.

One or more of the present embodiments can accomplish the energy requirement reduction by the elimination of hardware, including large three phase compressors, additional sub-systems inclusive of circulating water pumps, and large discharge blowers, as well as eliminating complicated connection piping. Embodiments can also eliminate the need for a support skid for the low power heat removing system, as well as the need for multiple top and/or multiple side mounted AC units for the data centers.

In one or more embodiments, the heat piping of the low power heat removing system does not require external power inputs to circulate a cooling medium, such as refrigerant compressors that are large power consumers. The low power heat removing system can operate exclusively using low power air circulation fans to move ambient air over heat sinks to dissipate heat into external air.

In embodiments, a small $\frac{1}{5}$ capacity AC unit can be used to supplement cooling of the air in the data center, such as if the external air near the data center is over seventy degrees Fahrenheit.

In operation, when the heat is dissipated into the external air from the heat sinks, the coolant inside the heat piping of the low power heat removing system can be naturally forced back inside a heat source by fluid disposed behind the coolant that has not had the heat removed; thereby causing a natural circulation from hot to cold. The fluid can continue to circulate without external energy input as long as the interior or chamber of the data center is hotter than the ambient external air.

One or more embodiments relate to the data center with the low power heat removing system that is designed to dramatically decrease electrical energy need to cool a mobile or stationary data center.

Typical data centers can range in length from about 10 feet to about 60 feet. One or more embodiments can include a heat pipe configuration that is integral with a wall or ceiling of the data center, which can essentially form a portion of the wall or ceiling while using fins to collect and dissipate heat; thereby creating a heat transfer process that is highly efficient and reduces electrical consumption by the data center for cooling by an average of 92 percent.

For example, for a system with 200 KW of continuous operation of heat removal, the dramatic reduction of electrical power requirements to cool the data center can result in savings of as much as $85,000 per year, relieve the energy requirements on utility systems, and reduce pollution.

Turning now to the Figures, FIG. 1 depicts an embodiment of a data center 10, which can be an air cooled mobile and/or modular facility.

The data center 10 can have a plurality of walls, such as wall 11a and wall 11b. The data center 10 can have an inside ceiling 70 disposed in parallel and separated from an outside top to form an air flow space, a closable opening 14, and a base 16, which can be connected to the walls 11a-11b.

The closable opening 14 can be a locking, water-tight, sealed opening, such as a door.

The data center 10 can be made of welded steel, creating an integral structure that can be lifted, such as by a crane. In one or more embodiments, the data center 10 can be made of plate steel having a thickness ranging from about 3/16 of an inch to about 3/4 of an inch.

The data center 10 can have a height ranging from about 8 feet to about 25 feet, width ranging from about 4 feet to 15 about feet, and depth ranging from about 10 feet to about 60 feet.

A small air conditioner 72 can be configured to be installed on a portion of the data center 10 to provide additional cooling when required.

FIG. 2 depicts a cut view the data center 10 detailing portions of a system 8.

The data center 10 can have heat generating electronics 18 disposed within a chamber 17. For example, the heat generating electronics 18 can be computer equipment elements, telecommunications equipment, data archival equipment, processing equipment, testing equipment, event recording equipment, logging equipment, power electronics, or combinations thereof.

The heat generating electronics 18 can be racked within the chamber 17 of the data center 10 surrounding an interior portion of the walls 11a-11b of the data center 10.

The heat generating electronics 18 can separate the chamber 17 into a first segment 13 and a second segment 15. The first segment 13 can have air with a first British thermal unit (BTU) content, such as inner heated air 38. The second segment 15 can have air with a second BTU content, such as cooler chamber air 39. The first BTU content can be larger than the second BTU content. In operation, the heat generating electronics 18 can draw in the cooler chamber air 39, such as through a heat generating electronics fan 21, for cooling the heat generating electronics 18. The heat generating electronics 18 can transfer heat to the cooler chamber air 39, thereby forming the inner heated air 38 for expulsion into the first segment 13.

The data center 10 can have the inside ceiling 70 disposed below the outside top 12 and above the base 16. The air flow space 19 can be formed between the inside ceiling 70 and the outside top 12.

A first interior fan 22 can be disposed on the inside ceiling 70, and can be used to cool the data center 10 without the need for heavy duty air conditioning systems that consume large amounts of power.

The first interior fan 22 can be a variable speed low voltage fan with one or more blades. For example, the first interior fan 22 can have a low voltage of 120 volts.

The first interior fan 22 can be connected to a power supply 24. The first interior fan 22 can blow air from the air flow space 19 towards the base 16, creating a first air flow 26. For example, the first air flow 26 can be at a speed of about 1,150 linear feet per minute.

The power supply 24 can be a 120 volt, 12 volt, 6 volt, 48 volt, or 220 volt power supply. The power supply 24 can be electricity from an electric municipality grid, a generator, a fuel cell, a battery, a solar cell, a hydroelectric power supply, a wind power generator, or combinations thereof.

A second interior fan 28 can be connected to the power supply 24 to assist in providing a general circulation of air 31 around the walls 11a-11b, the base 16, and between the outside top 12 and the inside ceiling 70. The second interior fan 28 can be disposed in a portion of the air flow space 19.

A heat sink 32, which can be a solid material, can be configured to be integrally mounted in one of the walls 11a-11b of the data center 10, such as the wall 11a.

The heat sink 32 can be an extruded metal block, which can be made of copper, aluminum, or alloys thereof. The heat sink 32 can be totally or partially anodized to protect the heat sink 32 from environmental decay and to provide cathodic protection.

The heat sink 32 can have structural integrity, enabling the heat sink 32 to act as a portion of a non-load bearing wall or non-load bearing ceiling of the data center 10.

The heat sink 32 can have a length and height equal to or less than the length and height of the wall 11a, and a depth slightly shallower than the wall 11a, such that the heat sink 32 can be attached to a wall frame assembly of the wall 11a.

The heat sink 32 can have one or more fins connected to a finless heat collecting portion, which can be solid. The fins can contact the inner heated air 38 in the data center 10.

The fins of the heat sink 32 can transfer heat from the inner heated air 38 while the inner heated air 38 moves across the fins of the heat sink 32. In one or more embodiments, the heat sink 32 can have from about six fins to about four hundred fins.

The fins can be connected with an outer fluid filled finless heat collection portion of the heat sink 32, allowing for thermal dissipation of heat absorbed by the heat sink 32 into fluid of an outer heat pipe assembly 42 in thermal communication with the outer fluid filled finless heat collection portion. As such, the outer fluid filled finless heat collection portion can form a heated fluid.

The outer heat pipe assembly 42 can have outer fins for receiving the heated fluid from the outer fluid filled finless heat collection portion, and allowing for heat dissipation through the outer fins to form a cooled fluid.

The outer fins of the outer heat pipe assembly 42 can be affected by a first external fan 46, which can pull external air 48 over the outer fins of the outer heat pipe assembly 42 through a forced air duct; thereby transferring heat from the outer fins to form a heated air 50.

A second external fan 52 can exhaust the heated air 50 away from the data center 10. The first external fan 46 and the second external fan 52 can be variable speed fans, and can be connected to the power supply 24.

The first interior fan 22, second interior fan 28, first external fan 46, and second external fan 52 can be controlled by a controller 62.

In embodiments, the controller 62 can be a variable speed controller for causing one or more of the first interior fan 22, second interior fan 28, first external fan 46, and second external fan 52 to operate at one or more speeds simultaneously.

For example, the controller 62 can include a program logic controller, which can allow the controller 62 to be configured for controlling one or more of the first interior fan 22, second interior fan 28, first external fan 46, and second external fan 52 based on preset limits that can be stored in the controller 62.

The controller 62 can receive temperature signals from a first powered transducer 54. The first powered transducer 54 can be configured for installation within the data center 10 for determining a first temperature within the data center 10.

The controller 62 can connect to a second powered transducer 58 secured to a portion of the outer heat pipe assembly 42 for determining a second temperature.

The controller 62 can connect to a third powered transducer 60, which can be secured proximate to the fins of the heat sink 32 for determining a third temperature, which can be a temperature of the inner heated air 38.

The first powered transducer 54, the second powered transducer 58, and the third powered transducer 60 can each be connected to both the controller 62 and the power supply 24. Each of the first powered transducer 54, the second powered transducer 58, and the third powered transducer 60 can be standard 100 ohm platinum transducers.

The controller 62 can communicate with a network 74. The network 74 can be the internet, a local area network, satellite network, or another communications network. The network 74 can be in communication with a client device 77 of a user 79, allowing for remote monitoring and controlling of the system 8.

The data center 10 can also have a display 63 disposed therein and in communication with the controller 62, allowing for local monitoring and controlling of the system 8.

The controller 62 can also be connected to the first interior fan 22, the second interior fan 28, the first external fan 46, the second external fan 52, and the power supply 24.

The controller 62 can control the heat sink 32 by controlling air flow using the first interior fan 22, second interior fan 28, first external fan 46, and second external fan 52. In one or more embodiments, the controller 62 can be configured to control one or more of the heat sinks in parallel.

In embodiments, the controller 62 can be configured to dissipate thirty kilowatts of heat per vertical section in the data center 10. Each of the vertical sections can be one vertical portioned off section of the overall data center 10, which can have independent server blades, rackings, and power supplies.

The controller 62 can be configured to control the first interior fan 22, second interior fan 28, first external fan 46, and second external fan 52 to create a lateral airflow between the outside top 12 and the inside ceiling 70 simultaneously while creating an air flow from the heat sink 32 towards the inside ceiling 70 and into the air flow space 19.

The small air conditioner 72 can be mounted in the outside top 12 or one of the walls 11a-11b, such as the wall 11b, and can be connected to the power supply 24 and the controller 62. The small air conditioner 72 can have less than ⅕ of a cooling requirement for cooling the entire data center 10. The small air conditioner 72 can be used when temperatures outside of the data center 10 are above seventy degrees Fahrenheit.

For example, a preset limit can be seventy degrees Fahrenheit for a low set point and eighty degrees Fahrenheit for a high set point within the data center 10. The controller 62 can use computer instructions in a data storage thereof to keep the first temperature of the cooler chamber air 39 between these two set points, such as by turning on and off the first interior fan 22, second interior fan 28, first external fan 46, and second external fan 52; adjusting the speeds of the first interior fan 22, second interior fan 28, first external fan 46, and second external fan 52; or turning on and off the small air conditioner 72.

Figure 3B:
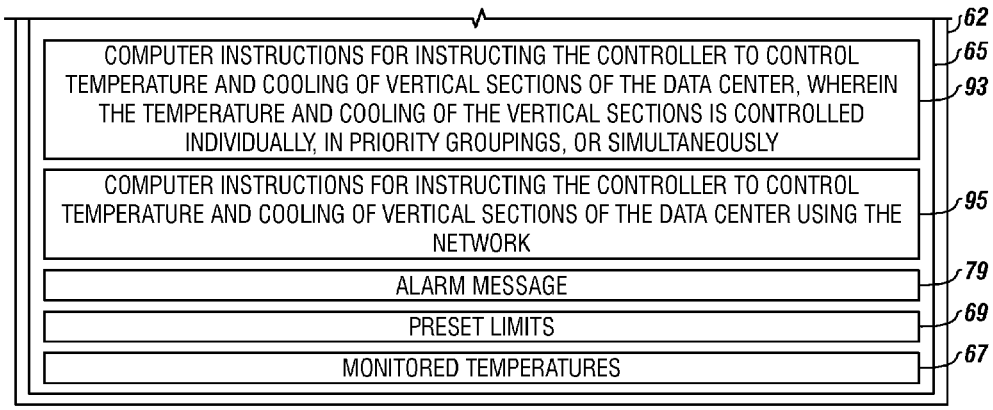

FIGS. 3A-3B depict an embodiment of the controller 62, which can include a processor 64 in communication with the data storage 65 and the display 63.

The data storage 65 can have various computer instructions for monitoring and controlling temperatures inside of one or more portable buildings.

For example, the data storage 65 can include computer instructions to monitor the temperature of the inner heated air in the portable building 66a.

The data storage 65 can include computer instructions to monitor the temperature of at least one of the outer fins 66b.

The data storage 65 can include computer instructions to monitor the cooler chamber air 66c.

The data storage 65 can include computer instructions to compare each monitored temperature to preset limits 66d.

The data storage 65 can include computer instructions to, when the monitored temperatures meet or exceed the preset limits, individually: actuate the first interior fan, second interior fan, first external fan, and second external fan; regulate fan speeds of the first interior fan, second interior fan, first external fan, and second external fan; or turn off the first interior fan, second interior fan, first external fan, and second external fan 66e.

For example, if the preset limits 69 require the temperature of the cooler chamber air to remain between 70 degrees Fahrenheit and 80 degrees Fahrenheit and the monitored temperature is determined, using one of the powered transducers, to be 85 degrees Fahrenheit, then the computer instructions can instruct the controller 62 to actuate the first interior fan, second interior fan, first external fan, and second external fan, or to increase a speed of the first interior fan, second interior fan, first external fan, and second external fan.

The data storage 65 can include computer instructions to instruct the processor to compare the monitored temperatures to preset limits, and to control fan speeds individually or simultaneously to cause temperatures in the portable building to remain within the preset limits 71.

The data storage 65 can include computer instructions to allow the processor to turn on and turn off and regulate air flow from the small air conditioner mounted in one of the walls or in the inside ceiling for use when outside air is over seventy degrees Fahrenheit or above another preset value 75.

The data storage 65 can include computer instructions to provide an alarm message when the monitored temperatures exceed or fall below the preset limits, wherein the alarm message is provided to: the client device, a computer, the display, or combinations thereof 78.

The data storage 65 can include computer instructions to ensure that air flowing across the inner heat sink remains in contact with each of the heat sinks to optimize heat transfer from the portable building 81.

The data storage 65 can include computer instructions to enable the user with the client device to connect to the controller and view a status of temperatures of at least one portable building over the network 90.

The data storage 65 can include computer instructions to form an executive dashboard on the client device enabling the user to simultaneously view the status of the multiple portable buildings 92.

The data storage 65 can include computer instructions for instructing the controller to control temperature and cooling of the vertical sections of the portable building, wherein the temperature and cooling of the vertical sections is controlled individually, in priority groupings, or simultaneously 93.

For example, if the portable building has three vertical sections, and if only one of the vertical sections is outside of the preset limits 69, then the controller 62 can control one or more of the individual fans associated with that vertical section.

The data storage 65 can include computer instructions for instructing the controller to control temperature and cooling of the vertical sections of the portable building using the network 95.

The alarm message 79, preset limits 69, and monitored temperatures 67 can be stored in the data storage 65.

Figure 4A:
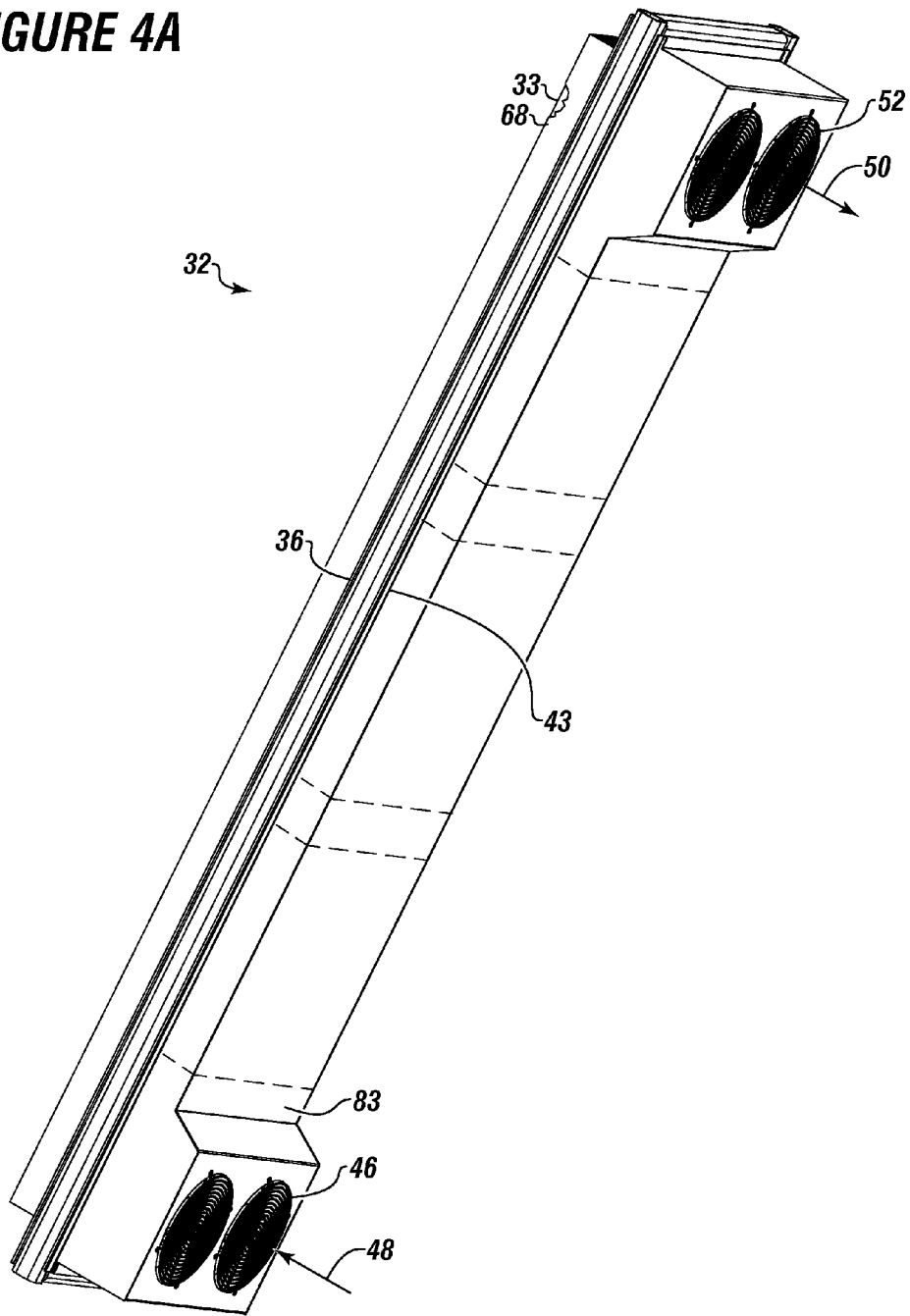
FIG. 4A depicts a detailed perspective view of the heat sink according to one or more embodiments.

FIG. 4A depicts a perspective view of the heat sink 32, and FIG. 4B depicts a side cut view of the heat sink 32 and outer heat pipe assembly 42.

The heat sink 32 can be connected with the outer heat pipe assembly 42.

The heat sink 32 can include one or more fins 33 and a coating 68, which can be a non-electrically conductive coating. The coating 68 can be anodized gold, anodized silver, titanium, platinum, iridium, or a similar secondary heat conductive surface for preventing degradation from oxidation or other environmental factors.

In embodiments, the outer heat pipe assembly 42 can be coated, such as with an anodized aluminum, alloy of aluminum, copper, anodized copper, or combinations of these materials.

The outer heat pipe assembly 42 can be made of a metal pipe and can have an inner diameter that varies depending on a designed heat load. For example, the inner diameter of the outer heat pipe assembly 42 can include thousands of small pipes or capillaries therein, with each small pipe or capillary having an inner diameter of less than two mm. The outer heat pipe assembly 42 can have a pipe base with small pipes and fins, such as those made by ACT in Pennsylvania.

The fins 33 can be connected to a finless heat collecting portion 36, which can be solid.

An outer fluid filled finless heat collection portion 43 of the outer heat pipe assembly 42 can be disposed adjacent one or more outer fins 44, and between the outer fins 44 and the finless heat collecting portion 36. The outer fluid filled finless heat collection portion 43 can be in thermal communication with the finless heat collecting portion 36.

The outer fluid filled finless heat collection portion 43 can allow for thermal dissipation of heat absorbed by the heat sink 32 into fluid of the outer fins 44 of the outer heat pipe assembly 42.

The outer heat pipe assembly 42 can have a fan assembly, including the first external fan 46 and the second external fan 52 for forced air cooling.

In operation, heat from the inner heated air can be transferred to the fins 33, heat from the fins 33 can be transferred to the finless heat collecting portion 36, heat from the finless heat collecting portion 36 can be transferred to the outer fluid filled finless heat collection portion 43, and heat from the outer fluid filled finless heat collection portion 43 can be transferred to the outer fins 44.

For example, the outer fluid filled finless heat collection portion 43 can transfer heat from the finless heat collecting portion 36 into a fluid to form a heated fluid 40. The outer fins 44 can receive the heated fluid 40 from the outer fluid filled finless heat collection portion 43. Heat from the heated fluid 40 can be dissipated through the outer fins 44, thereby forming a cooled fluid 45, which can flow back to the outer fluid filled finless heat collection portion 43.

For example, the first external fan 46 can draw in the external air 48 into a forced air duct 83, which can receive the external air 48 and flow the external air 48 across the outer fins 44, thereby causing a heat exchange and forming the heated air 50.

The second external fan 52 can draw the heated air 50 out away from the outer fins 44. The second external fan 52 can operate at a higher suction to draw the external air 48 through the outer heat pipe assembly 42.

In one or more embodiments, the outer fins 44 can be very thin and short microstructures. A large quantity of the very thin and short microstructures can provide for fast and lightweight thermal dissipation.

In one or more embodiments, the outer heat pipe assembly 42 can have several hundred of the outer fins 44.

FIG. 5 depicts a side view of an outside of the data center 10 with one heat sink having six outer heat pipe assemblies 42a-42f.

The data center 10 can have the vertical sections 76a-76g. Each of the vertical section 76a-76g can contain racks with servers that generate heat or other heat generating electronics.

The data center 10 can have the first external fans 46a-46n for drawing in the exterior air, and the second external fans 52a-52n for expelling the heated air.

Each of the first external fans 46a-46n and the second external fans 52a-52n for each of the vertical sections 76a-76g can be operated independently, simultaneously, or in priority groupings.

The data center 10 can have the small air conditioner 72, which can be a 15 ton A/C unit, such as one made by TRANE™.

The data center 10 can be installed in a transportable container 73, such as a shipping container for easy transport by land or sea. In one or more embodiments, the transportable container 73 can contain multiple portable buildings.

The transportable container 73 can be a vertical lift container, skid mounted container, or a container that is transportable by rail, boat, or truck.

In one or more embodiments, the transportable container 73 can be a moveable custom made container, which can provide additional protection and additional space for the data center 10.

FIG. 6 depicts an embodiment of the system installed into multiple data centers 10a-10b that are connected together.

The walls 11a-11c of the data centers 10a-10b can be removed and/or connected together, such that the portable buildings share the means for flowing air. For example, the wall 11a of the data center 10a can be connected with the wall 11c of the data center 10b.

The data centers 10a-10b can have one or more of the heat sinks 32a-32b for transferring heat from within the data centers 10a-10b, as well as the outer heat pipe assemblies 42 for transferring the heat to the external air.

Figure 7:
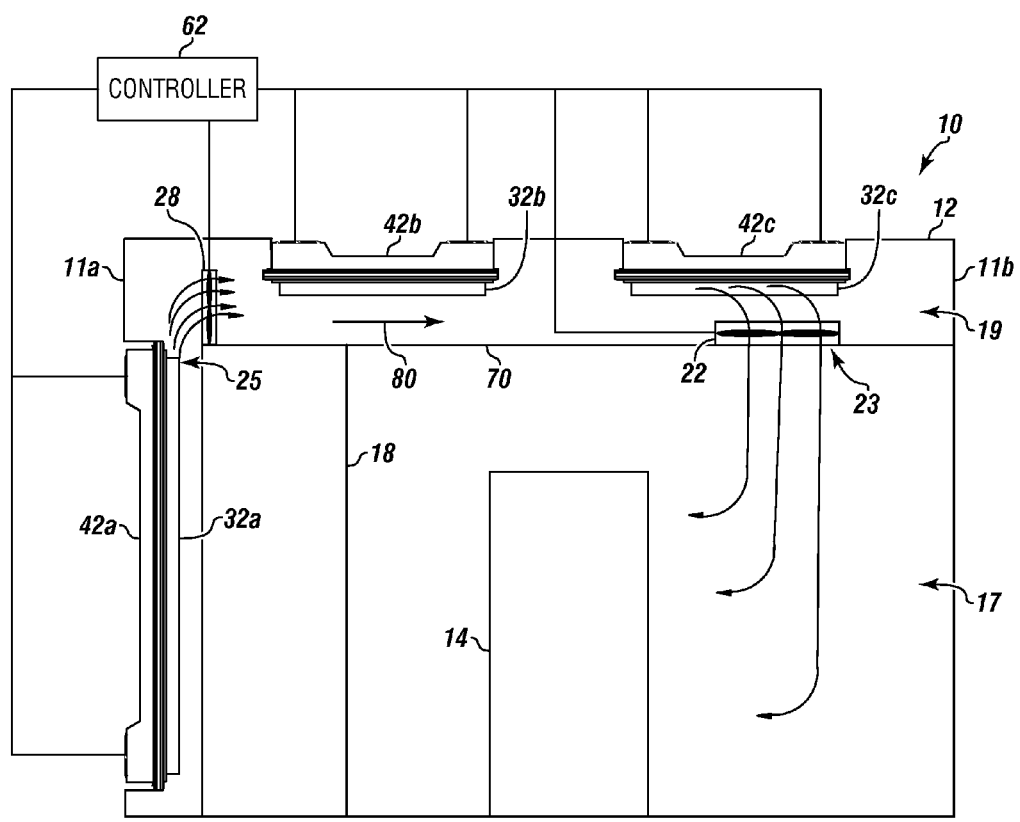
FIG. 7 depicts a cross sectional view of the system installed in the data center having outside top mounted heat sinks according to one or more embodiments.

FIG. 7 depicts an embodiment of the data center 10 with the closable opening 14, as well as the inside ceiling 70 and the outside top 12 forming the air flow space 19.

The inside ceiling 70 can have a first opening 23. The first interior fan 22 can blow air from within the air flow space 19 into the chamber 17 through the first opening 23.

The second interior fan 28 can blow air from a second opening 25 of the inside ceiling 70 into the air flow space 19, thereby creating a cross air flow 80.

The data center 10 can have the heat sink 32a, which can be wall mounted into one of the walls 11a-11b, such as the wall 11a. For example, the heat sink 32a can be disposed adjacent the heat generating electronics 18.

The data center 10 can have the heat sink 32b and the heat sink 32c, which can both be configured to be installed on the outside top 12. For example, the heat sink 32b and the heat sink 32c can be used when the heat generating electronics 18 vent upwards into the air flow space 19.

Each of the heat sinks 32a-32c can be associated with the outer heat pipe assemblies 42a, 42b, and 42c, which can each have two pairs of circulating fans to provide for faster thermal heat transfer from the chamber 17 of the data center 10 to an outside of the data center 10.

Each of the heat sinks 32a-32c associated with the outer heat pipe assemblies 42a-42c can be connected to the controller 62.

FIG. 8 depicts a plurality of data centers 10a-10b controlled by one of the controllers 62.

The plurality of data centers 10a-10b can be connected to the controller 62, and the controller 62 can be connected to the network 74.

The client device 77 can be connected to the controller 62 and data centers 10a-10b through the network 74, allowing the user 79 to remotely monitor temperatures and receive alarm messages. The client device 77 can be a cell phone, computer, or other communications device.

The controller 62 can simultaneously operate the plurality of data centers 10a-10b.

The data centers 10a-10b can have thermal partitions 35a-35h formed by the heat generating electronics 18a-18d that extend from the bases 16a-16b to the inside ceilings 70a-70b.

The thermal partitions 35a-35h can form the chambers 17a and 17b, thereby separating the inner heated air 38a-38d from the cooler chamber air 39a-39d.

Each of the data centers 10a-10b can have the display 63a-63b for locally displaying temperatures and information on the system.

Each of the data centers 10a-10b can have one or more of the heat sinks 32a-32d, which can contact the inner heated air 38a-38d for cooling thereof.

Each of the data centers 10a-10b can have one or more outer heat pipe assemblies 42a-42d, which can transfer heat to the external air.

Each of the chambers 17a-17b can have one or more of the first interior fans 22a-22d. For example, the chamber 17a can have the first interior fan 22a and the first interior fan 22b, and the chamber 17b can have the first interior fan 22c and the first interior fan 22d.

The first interior fans 22a-22d can receive air from the second interior fans 28a-28d through the air flow space 19a-19b, and can provide the cooler chamber air 39a-39d to the chambers 17a-17b.

Each of the data centers 10a-10b can have the walls 11a-11d and outside tops 12a-12b.

FIG. 9 depicts a diagram of an embodiment of the method for cooling a facility, such as a portable building.

The method can include mounting the heat sink in at least one wall or outside top of the facility containing the heat generating electronics, forming a non-load bearing integral portion of the wall or outside top, as illustrated by box 100.

The method can include mounting the outer heat pipe assembly to the finless heat collecting portion of the heat sink, as illustrated by box 102.

The method can include installing the forced air ducts around the outer heat pipe assembly to contain air flow around the heat pipes, as illustrated by box 104.

The method can include installing the first external fan to force air into the forced air duct from outside of the facility, as illustrated by box 106.

The method can include installing the second external fan to pull air from the forced air duct to outside of the facility, as illustrated by box 108.

The method can include installing the first interior fan to flow air from a ceiling air duct into the facility, as illustrated by box 110.

The method can include installing the second interior fan to pull air from the facility into the ceiling air duct, as illustrated by box 112.

The method can include installing the first powered transducer in the facility proximate to a section of the facility having the lowest temperature, as illustrated by box 114.

The method can include installing the second powered transducer in the facility in the air flow proximate to the fins of the outer heat pipe assembly, as illustrated by box 116.

The method can include installing the third powered transducer proximate to the fins of the heat sink, as illustrated by box 118.

The method can include connecting the first powered transducer, second powered transducer, third powered transducer, first external fan, second external fan, first interior fan, and second interior fan to the controller, wherein the controller has the processor and the data storage, as illustrated by box 120.

The method can include using computer instructions in the data storage to monitor temperature in the facility, actuate the fans, regulate the fan speeds, and stop the fans when monitored temperatures of the facility meet or exceed preset limits, as illustrated by box 122.

The method can include installing a small capacity air conditioning unit, connecting the small capacity air conditioning unit to the controller, and providing an assist to lower the temperature of air in the facility to a temperature less than the temperature outside of the facility, as illustrated by box 124.

While these embodiments have been described with emphasis on the embodiments, it should be understood that within the scope of the appended claims, the embodiments might be practiced other than as specifically described herein.

What is claimed is:

1. A data center with a low power heat removal system, wherein the data center comprises:

a. a plurality of walls, an outside top engaging each of the walls, an inside ceiling in parallel and separated from the outside top forming an air flow space, a base engaging each of the walls opposite the inside ceiling forming a chamber, and a closable opening formed in one of the walls;

b. a plurality of heat generating electronics disposed within the chamber separating the chamber into a first segment comprising inner heated air with a first BTU content and a second segment comprising cooler chamber air with a second BTU content, wherein the first BTU content is larger than the second BTU content;

c. a first interior fan connected to a power supply for blowing interior air from within the air flow space through a first opening in the inside ceiling towards the base creating a first air flow;

d. a second interior fan connected to the power supply to assist in providing a general circulation of air in the chamber around the walls, the base, and the inside ceiling, and for blowing the inner heated air through a second opening in the inside ceiling;

e. at least one heat sink, wherein each heat sink comprises:
  (i) a finless heat collecting portion; and
  (ii) fins connected to the finless heat collecting portion, wherein the inner heated air transfers heat to the fins, and wherein the fins transfer heat to the finless heat collecting portion;

f. at least one outer heat pipe assembly, wherein each outer heat pipe assembly is in thermal communication with at least one of the finless heat collecting portions, and wherein each outer heat pipe assembly comprises:
  (i) an outer fluid filled finless heat collection portion, wherein outer fluid in the outer fluid filled finless heat collection portion absorbs heat from at least one of the finless heat collecting portions and forms a heated fluid; and
  (ii) outer fins for receiving the heated fluid and dissipating heat from the heated fluid forming a cooled fluid, wherein the cooled fluid circulates to the outer fluid filled finless heat collection portion in a closed loop;

g. a first external fan connected to the power supply for blowing external air over the outer fins and transferring heat from the outer fins, forming heated air, the external air from outside of the data center;

h. a second external fan connected to the power supply for exhausting the heated air away from the outer fins to outside of the data center i. a first powered transducer located within the chamber for determining a first temperature of the cooler chamber air in the second segment;

j. at least one second powered transducer, wherein each second powered transducer is secured to one of the outer heat pipe assemblies for determining a second temperature of at least one of the outer fins containing the heated fluid;

k. a third powered transducer secured proximate to the fins for determining a third temperature of the inner heated air in the data center; and l. a controller connected to the first powered transducer, the second powered transducer, the third powered transducer, the first interior fan, the second interior fan, the first external fan, the second external fan, and the power supply, wherein the controller comprises:
  (i) a processor;
  (ii) a data storage in communication with the processor; and
  (iii) computer instructions stored in the data storage to:
    (a) monitor the temperature of the inner heated air;
    (b) monitor the temperature of at least one of the outer fins;
    (c) monitor the temperature of the cooler chamber air;
    (d) compare each monitored temperature to preset limits; and
    (e) when the monitored temperatures meet or exceed the preset limits, individually:
      1. actuate the first interior fan, the second interior fan, the first external fan, and the second external fan;
      2. regulate fan speeds of the first interior fan, the second interior fan, the first external fan, and the second external fan; or
      3. turn off the first interior fan, the second interior fan, the first external fan, and the second external fan.

2. The data center of claim 1, wherein the controller is a variable speed controller for causing one or more of the first interior fan, the second interior fan, the first external fan, and the second external fan to operate at one or more speeds simultaneously.

3. The data center of claim 1, wherein the at least one heat sink is an extruded solid metal block.

4. The data center of claim 3, wherein the extruded metal block comprises copper, aluminum, or alloys thereof.

5. The data center of claim 1, wherein the fins of each heat sink are hollow.

6. The data center of claim 1, further comprising a non-electrically conductive coating disposed on each heat sink to prevent degradation from oxidation.

7. The data center of claim 1, wherein each heat sink comprises from six fins to four hundred fins.

8. The data center of claim 1, wherein the heat generating electronics comprises: computer equipment elements, telecommunications equipment, data archival equipment, processing equipment, testing equipment, event recording equipment, logging equipment, power electronics, or combinations thereof.

9. The data center of claim 1, further comprising a small air conditioner installed in one of the walls or the outside top of the data center, wherein the small air conditioner has less than $\frac{1}{5}$ of a required capacity needed to cool the chamber, and wherein the small air conditioner maintains the cooler chamber air at a lower temperature than the external air when the external air is at a temperature exceeding seventy degrees Fahrenheit.

10. The data center of claim 1, wherein the data center is arranged in a transportable container.

11. The data center of claim 10, wherein the transportable container is a vertical lift container, a skid mounted container, or a container that is transportable by rail, boat, or truck.

12. The data center of claim 1, further comprising computer instructions for instructing the controller to control temperature and cooling of vertical sections of the data center, wherein the temperature and cooling of the vertical sections is controlled individually, in priority groupings, or simultaneously.

13. The data center of claim 1, further comprising computer instructions for instructing the controller to control temperature and cooling of vertical sections of the data center using a network.

14. The data center of claim 1, wherein the data center has from two vertical sections to twenty five vertical sections.

15. The data center of claim 1, wherein the controller simultaneously operates multiple data centers, and wherein each data center comprises multiple vertical sections.

16. The data center of claim 15, further comprising computer instructions in the data storage to enable a user with a client device to connect to the controller and view a status of temperatures of the at least one data center over a network.

17. The data center of claim 1, wherein the heat generating electronics extend from the base to the inside ceiling forming thermal partitions in the chamber separating the inner heated air from the cooler chamber air.

18. The data center of claim 1, further comprising a display in communication with the controller for displaying temperatures and information.

19. The data center of claim 18, further comprising computer instructions to provide an alarm message when the monitored temperatures exceed or fall below the preset limits, wherein the alarm message is provided to a member of the group consisting of: a client device, a computer, the display, and combinations thereof.

20. A data center with a low power heat removal system, wherein the data center comprises:

a. a plurality of walls, a closable opening formed in one of the walls, an outside top engaging each of the walls, an inside ceiling disposed in parallel to the outside top and separated from the outside top forming an air flow space, and a base engaging each of the walls opposite the inside ceiling forming a chamber;

b. heat generating electronics disposed within the chamber separating the chamber into a first segment comprising inner heated air and a second segment comprising cooler chamber air;

c. a first interior fan installed in the inside ceiling for blowing air from within the air flow space into the second segment;

d. a second interior fan for drawing the inner heated air into the air flow space;

e. a heat sink installed into one of the walls or the outside top, wherein the heat sink comprises:
   (i) a finless heat collecting portion; and
   (ii) fins connected to the finless heat collecting portion, wherein the inner heated air contacts the fins and transfers heat to the fins, and wherein the fins transfer heat to the finless heat collecting portion;

f. an outer heat pipe assembly comprising:
   (i) an outer fluid filled finless heat collection portion in thermal communication with the finless heat collecting portion, wherein fluid in the outer fluid filled finless heat collection portion absorbs heat from finless heat collecting portions and forms a heated fluid;
   (ii) outer fins for receiving the heated fluid and dissipating heat from the heated fluid forming a cooled fluid, wherein the cooled fluid circulates to the outer fluid filled finless heat collection portion in a closed loop;
   (iii) a first external fan for blowing external air over the outer fins and transferring heat from the outer fins, forming heated air, the external air from outside of the data center; and
   (iv) a second external fan for exhausting the heated air away from the outer fins to outside of the data center, g. a first powered transducer located within the chamber for determining a first temperature of the cooler chamber air in the second segment;

h. a second powered transducer secured to the outer heat pipe assembly for determining a second temperature of at least one of the outer fins containing the heated fluid;

i. a third powered transducer secured proximate to the fins for determining a third temperature of the inner heated air in the data center; and j. a controller connected to the first powered transducer, the second powered transducer, the third powered transducer, the first interior fan, the second interior fan, the first external fan, the second external fan, and the power supply, wherein the controller comprises:
   (i) a processor;
   (ii) a data storage in communication with the processor; and
   (iii) computer instructions stored in the data storage to:
      (a) monitor the temperature of the inner heated air;
      (b) monitor the temperature of at least one of the outer fins;
      (c) monitor the temperature of the cooler chamber air;
      (d) compare each monitored temperature to preset limits; and
      (e) when the monitored temperatures meet or exceed the preset limits, individually:
         1. actuate the first interior fan, the second interior fan, the first external fan, and the second external fan;
         2. regulate fan speeds of the first interior fan, the second interior fan, the first external fan, and the second external fan; or
         3. turn off the first interior fan, the second interior fan, the first external fan, and the second external fan.

\* \* \* \* \*